(12) United States Patent
Garnier

(10) Patent No.: US 6,366,137 B2
(45) Date of Patent: Apr. 2, 2002

(54) VERY LOW-POWER COMPARISON DEVICE

(75) Inventor: Christophe Garnier, Theys (FR)

(73) Assignee: STMicroelectrioncs S.A., Montrouge (FR)

( * ) Notice: Subject to any disclaimer, the term of this patent is extended or adjusted under 35 U.S.C. 154(b) by 0 days.

(21) Appl. No.: 09/795,055

(22) Filed: Feb. 26, 2001

(30) Foreign Application Priority Data

Feb. 28, 2000 (FR) .............................................. 00 02473

(51) Int. Cl.$^7$ ................................................. H03K 5/22
(52) U.S. Cl. .......................................... 327/64; 327/52
(58) Field of Search ............................. 327/50, 51, 52, 327/55, 58, 62, 63, 64, 65, 69, 70, 77, 78, 79, 82, 89, 90, 561, 563

(56) References Cited

U.S. PATENT DOCUMENTS

| 4,418,332 A | * 11/1983 | Mefford ........................ 327/65 |
| 4,529,892 A | * 7/1985 | Reilly et al. ................... 327/65 |
| 4,912,420 A | * 3/1990 | Parnell .......................... 327/65 |
| 5,063,580 A | * 11/1991 | Canfield et al. ............... 377/55 |
| 5,726,592 A | 3/1998 | Schulte et al. ................. 327/65 |
| 5,726,742 A | * 3/1998 | Nourrcier ...................... 327/69 |

OTHER PUBLICATIONS

Patent abstracts of Japan, vol. 009, No. 274 dated Oct. 31, 1985 & JP 60 117910, Nippon Denki KK.
Patent abstracts of Japan, vol. 006, No. 021 dated Feb. 6, 1982, & JP 56 140721 (Nec Corp.) Dated Nov. 4, 1981.
Patent abstracts of Japan, vol. 1998, No. 02 dated Jan. 30, 1998 & JP 09 270684 (Nec Kansai Ltd.) dated Oct. 14, 1997.
Patent abstracts of Japan, vol. 1997, No. 10 dated Oct. 31, 1997 & JP 09 161484 (Fujitsu Ltd.) dated Jun. 20, 1997.

* cited by examiner

Primary Examiner—My-Trang Nuton
(74) Attorney, Agent, or Firm—Lisa K. Jorgenson; Allen, Dyer, Dopplet, Milbrath & Gilchrist, P.A.

(57) ABSTRACT

The device for the comparison of the levels of two input signals MI, PI includes a first comparator COMP1, the switching of the comparator being expressed by a change-over of the output OUT1 of the comparator from a first logic state into a second logic state, the change-over of the output OUT1 from one logic state "0" into the other state "1" being faster than the change-over in the other direction. The device also includes a second comparator COMP2 with an identical structure, to whose input the signals to be compared are applied invertedly so that the switching operations in the comparators are inverted. The output of each comparator is applied to an associated logic circuit 1, 2 capable of accelerating the inverse switching in the other comparator for a change in the output corresponding to the fastest change-over.

18 Claims, 3 Drawing Sheets

US 6,366,137 B2

1

VERY LOW-POWER COMPARISON DEVICE

FIELD OF THE INVENTION

The invention relates to the field of very low-power comparison devices, and, more particularly, to electronic equipment (e.g. battery powered electronic equipment) where the power consumed is limited. Comparison devices with very low consumption are used especially in the biomedical field, and in portable equipment or sensors.

BACKGROUND OF THE INVENTION

In these fields, the electronic equipment must consume as little power as possible because the total current available is very limited. One microampere corresponds to an available order of magnitude. When it is sought to reduce the consumption of an electronic device, its performance characteristics are generally reduced. This is especially the problem with comparison devices. To reduce their consumption, it is sought to reduce the bias current. But the more this current is reduced, the lower the efficiency of the comparison devices, i.e. their switching becomes very slow. For example, a standard prior art comparator, biased at 60 microamperes, switches over in about a hundred nanoseconds. When biased at 500 nanoamperes it will switch over in six microseconds.

A standard comparator usually has at least two gain stages and one output stage used for the reshaping of the output signal, which includes a sequence of inverters. A comparator of this kind has dissymmetrical behavior in switching. It switches over more quickly in one direction than in another. This dissymmetry in switching is aggravated at very low bias current.

FIG. 1 shows a prior art comparator used to compare two signals MI and PI applied to the input. In general, one of the two signals is a reference signal. In the example, and as shown in FIG. 2, the signal MI is the reference signal with a level supposed to be constant and the signal PI is a signal with a variable level, given by an unspecified measurement circuit that is not shown. The signal MI is applied to the non-inverting input e+ and the signal PI is applied to the inverting input e−.

The comparator is powered by the two logic supply voltages VPLUS and VMINUS with VPLUS greater than VMINUS. In practice, VPLUS has a value between 2 and 5 volts depending on the technology used and VMINUS is equal to zero volts. In the example, the comparator comprises two gain stages ED1 and EA1. The gain stage E1 is the input stage of the comparator. At the inputs e+ and e−, it receives the two signals to be compared, MI and PI. To each input, there corresponds an arm of the stage. The first arm is associated with the non-inverting input e+. It comprises two transistors M1 and M2 series-connected between the power voltage VPLUS and a bias node N. The transistor M1, in the example, is a P type MOS transistor diode-mounted with the gate and drain connected together. The transistor M2 in one example is an N type MOS transistor. Its gate forms the non-inverting input e+ receiving the input signal M1.

The second arm is associated with the inverting input e−. It has two transistors M3 and M4 that are series-connected between the supply voltage VPLUS and the bias node N. The transistor M3, in the example, is a P type MOS transistor with its gate connected to the gate of the transistor M1 of the first arm (current mirror assembly). The transistor M4 is an N type MOS transistor. Its gate forms the inverting input e− receiving the input signal PI.

This input stage is biased by a bias current Ib generally given by a current mirror structure that comprises a transis-

2 tor M5 connected between the bias node N and the supply voltage VMINUS. The connection point between the transistor M3 and the transistor M4 gives the output signal of the stage applied to the input E1 of the second gain stage EA1. The signal at input E1 is such that, when the signal level PI becomes lower than that of the signal MI, it rises to "1" and when the level of the signal PI becomes greater than that of MI, it falls below "0".

The second gain stage comprises, in the example, a first transistor M6 biased by the bias current Ib. In the example, this current is a P type MOS transistor whose drain gives the output signal OUT1 of the comparator. When the input E1 rises to "1" (PI<MI), the transistor M6 is off and the output OUT1 falls to "0". So that the transistor M6 may be off, its gate which is connected to the input E1 should be brought from zero (VMINUS) to a potential higher than or equal to VPLUS-Vtp, Vtp being the threshold voltage of a P type MOS transistor. The output OUT1 then falls to zero (VMINUS), discharged by the bias current Ib. FIG. 1 shows the charging capacitance at output which corresponds to the gate capacitances of the inverters of the output stage (not shown).

When the input E1 falls to "0" (PI>MI), the transistor M6 is on, drawing the output OUT1 to "1". Now the transistor M6 comes on as soon as the input E1 goes from VPLUS to VPLUS-Vtp. The output transistor M6 is furthermore sized to facilitate the build-up of the output OUT1 to VPLUS.

Thus, it can be seen that the switch-over in the comparator which corresponds to the change-over of the output OUT1 from "0" to "1" is very fast because of the sizing of the transistor M6 in combination with the small variation in charge of the node E1 (from VPLUS to VPLUS-Vtp) needed to start making the transistor M6 come on.

The switch-over of the comparator which corresponds to the change-over of the output OUT1 from "1" to "0" is slower because of the greater variation in charge (from 0 to VPLUS-Vtp) on the node E1 needed to be able to turn the transistor M6 off. Furthermore, the discharging of the output node OUT1 from VPLUS to zero (VMINUS) depends on the bias current Ib. Since it is sought to have a very low bias current, this switching over is very slow in practice.

Thus, a prior art comparator has behavior that is asymmetrical in switching, aggravated by its low bias current.

FIG. 2 shows the progress of the output as a function of the level of the input signal PI as compared with the input signal MI taken as a reference, when the comparator is biased at a low bias current Ib in the range of 100 nanoamperes. When the input signal PI rises above the reference input signal MI, there is a fast build-up in voltage at the output OUT1. when the level of the signal PI returns below the input signal MI, there is first a plateau before the voltage falls back. This plateau is due to the double constraint of the build-up of the node E1 from 0 to VPLUS-Vtp and the discharging of the output OUT by a low bias current.

SUMMARY OF THE INVENTION

According to the invention, this technical problem of slow switching, aggravated at low bias current, is addressed by applying the signals PI and MI to be compared to a second comparator but invertedly so that they switch over invertedly with respect to each other. The output of each of the comparators is looped back to the other output by a control logic such that the change-over of the output of a comparator from "0" to "1" enforces the inverse switch-over in the other comparator.

In this way, the behavior of the comparison device is symmetrized with respect to the fastest switching. The gain in switching time greatly compensates for the additional consumption due to the use of two comparators.

Preferably, and given the field of application aimed at, namely the very low-power consumption values, preferably an amplifier input stage is planned for the application of the signals to be compared at input of the two comparators.

As characterized, the invention therefore relates to a device for the comparison of the levels of two input signals MI, PI comprising a first comparator where the switching of the comparator is expressed by a change-over of the output of the comparator from a first logic state into a second logic state, and the change-over of the output from the logic state "0" into the other state "1" is faster than the change-over in the other direction. The device comprises a second comparator with an identical structure, to whose input the signals to be compared are applied invertedly so that the switching operations in the comparators are inverted, the output of each comparator is applied to an associated logic circuit capable of accelerating the inverse switching in the other comparator for a change in the output corresponding to the fastest change-over.

BRIEF DESCRIPTION OF THE DRAWINGS

Other features and advantages of the invention shall be presented in the following description of an exemplary embodiment of the invention with reference to the appended figures, of which.

DETAILED DESCRIPTION OF THE PREFERRED EMBODIMENTS

Figure 1:
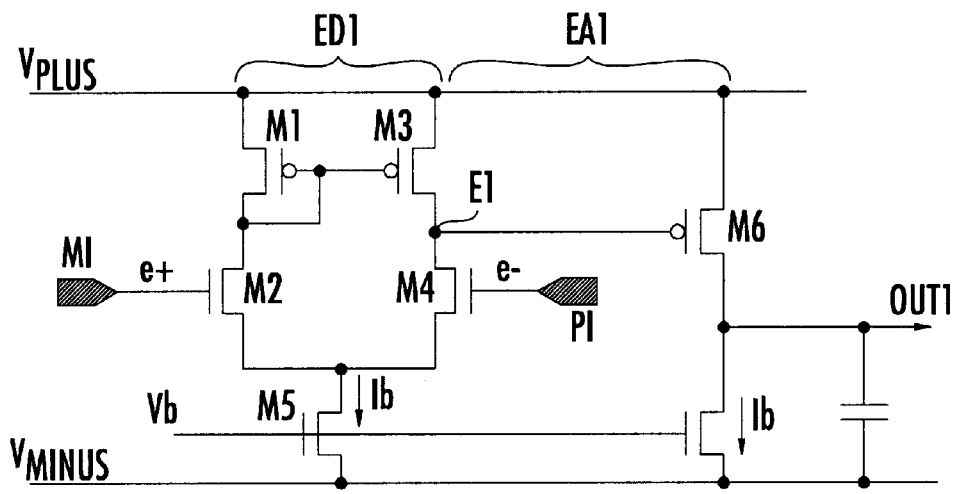
FIG. 1 is a schematic diagram illustrating a prior art comparator with two gain stages.
Figure 3:
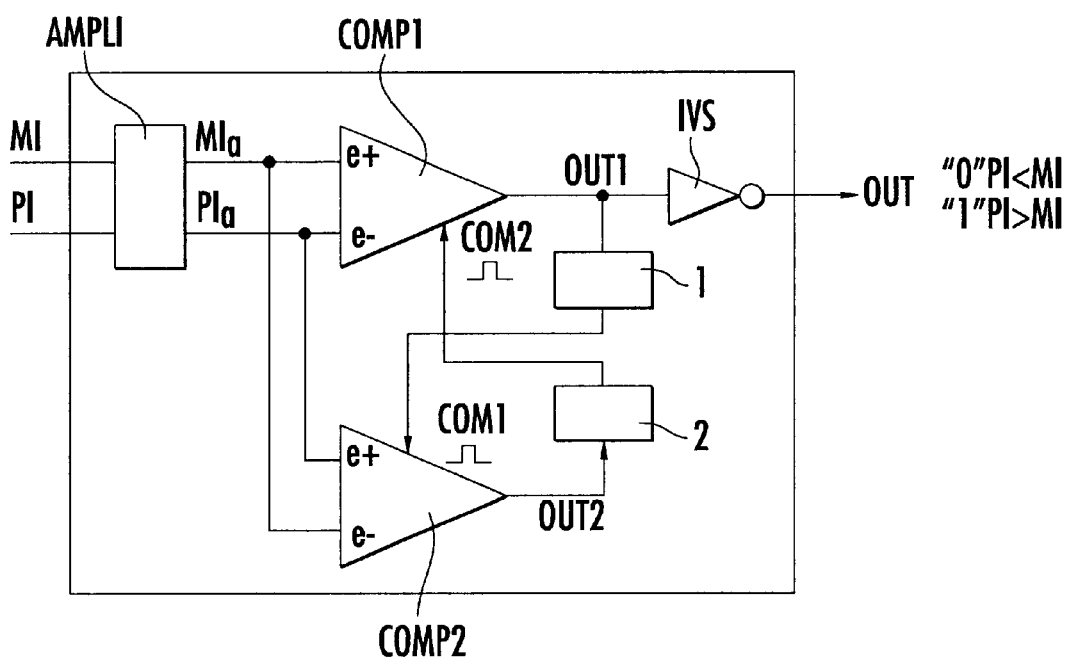
FIG. 3 is a schematic diagram of a comparison device according to the invention.
Figure 2:
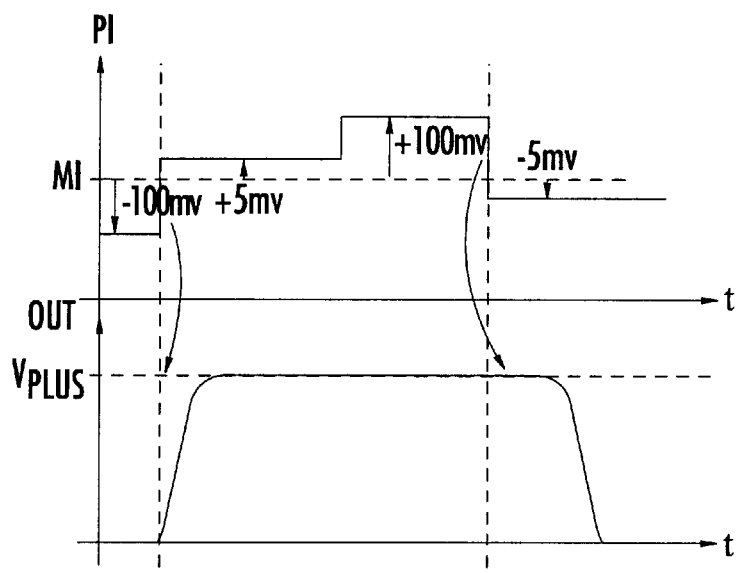
FIG. 2 is a timing diagram illustrating the switching characteristics of the comparator of FIG. 1.

FIG. 3 shows a comparison device according to the invention. The device includes a first comparator COMP1 and a second comparator COMP2 to compare each of the input signals PI and MI which, however, are applied invertedly to the inputs of these comparators. Preferably, the comparison device comprises an amplifier stage AMPLI to amplify the input signals MI and PI. This amplifier stage therefore gives amplified inverse signals MIa and PIa at output. These signals are applied to the comparators COMP1 and COMP2. In the example, the signal MIa is applied to the non-inverting input e+ of the comparator COMP1 and to the inverting input e− of the comparator COMP2. The signal PIa is applied to the inverting input e− of the comparator COMP1 and to the non-inverting input e+ of the comparator COMP2. The comparators COMP1 and COMP2 have an identical structure, for example, as discussed with respect to FIG. 1.

Since the signals MIa and PIa are inverted with reference to the signals MI and PI, the selection switching of the output OUT1 of the first comparator from "0" to "1" corresponds to a signal PI whose level goes below the signal MI. If it is sought to use the output OUT1 as an output of the device, it is then necessary to plan for an additional output inverter IVS to retrieve the usual logic: OUT changes over from "0" to "1" for PI passing above MI; and from "1" to "0" for PI passing below MI. But the signal OUT1 changes over from "1" to "0" for PI passing above MI; and from "0" to "1" for PI passing below MI.

The comparator COMP2 switches over invertedly. Its output OUT2 therefore changes over from "0" to "1" when the level of the signal PI passes below the level of the signal MI and from "1" to "0" if not. The outputs OUT1 and OUT2 correspond to the outputs O1 and O2 of the second amplifier stage, after reshaping. Thus, as was seen with reference to FIG. 1, the change-over of the outputs OUT1 and OUT2 from "1" to "0" corresponds to the slow switching operations while the change-over of the outputs OUT1 and OUT2 from "0" to "1" corresponds to the fast switching operations.

The output OUT1 of the first comparator COMP1 is applied to the second comparator COMP2 by a logic circuit 1 so that the change-over of the output OUT1 from "0" to "1" forces the inverse switching in the second comparator COMP2. Similarly, the output OUT2 of the second comparator COMP2 is applied to the first comparator COMP1 by a logic circuit 2 so that the change-over of the output OUT2 from "0" to "1" forces the inverse switching in the first comparator COMP1.

The logic circuits 1 and 2 have an identical structure. They each deliver a control pulse at output, respectively Com1, Com2, whose active level forces the charging or discharging of internal nodes of the comparator concerned.

Figure 4:
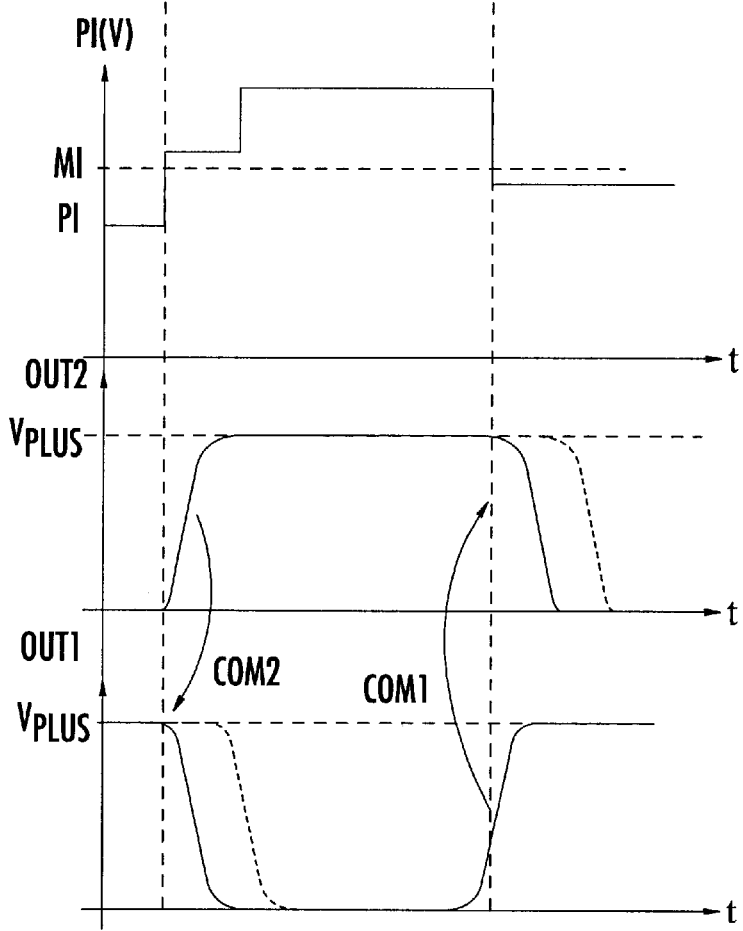
FIG. 4 is a timing diagram illustrating the switching characteristics associated with the comparison device of FIG. 3.

Thus, and as shown in FIG. 4, when the level of the signal PI goes above the level of the signal MI, the output OUT2 goes from "0" to "1". The control pulse signal Com2 forces the inverse switching in the selection switch COMP1, the output OUT1 of which switches over far more swiftly from "1" to "0" than in the prior art. Similarly, when the level of the signal PI goes below the level of the signal MI, the output OUT1 goes from "0" to "1". The control pulse signal Com1 forces the inverse switching in the switch COMP2, the output OUT2 of which switches over far more swiftly from "1" to "0" than in the prior art. Dashes have been used to show the switching characteristics according to the prior art.

A comparison device according to the invention thus has a switching behavior that is practically symmetrical.

Figure 5:
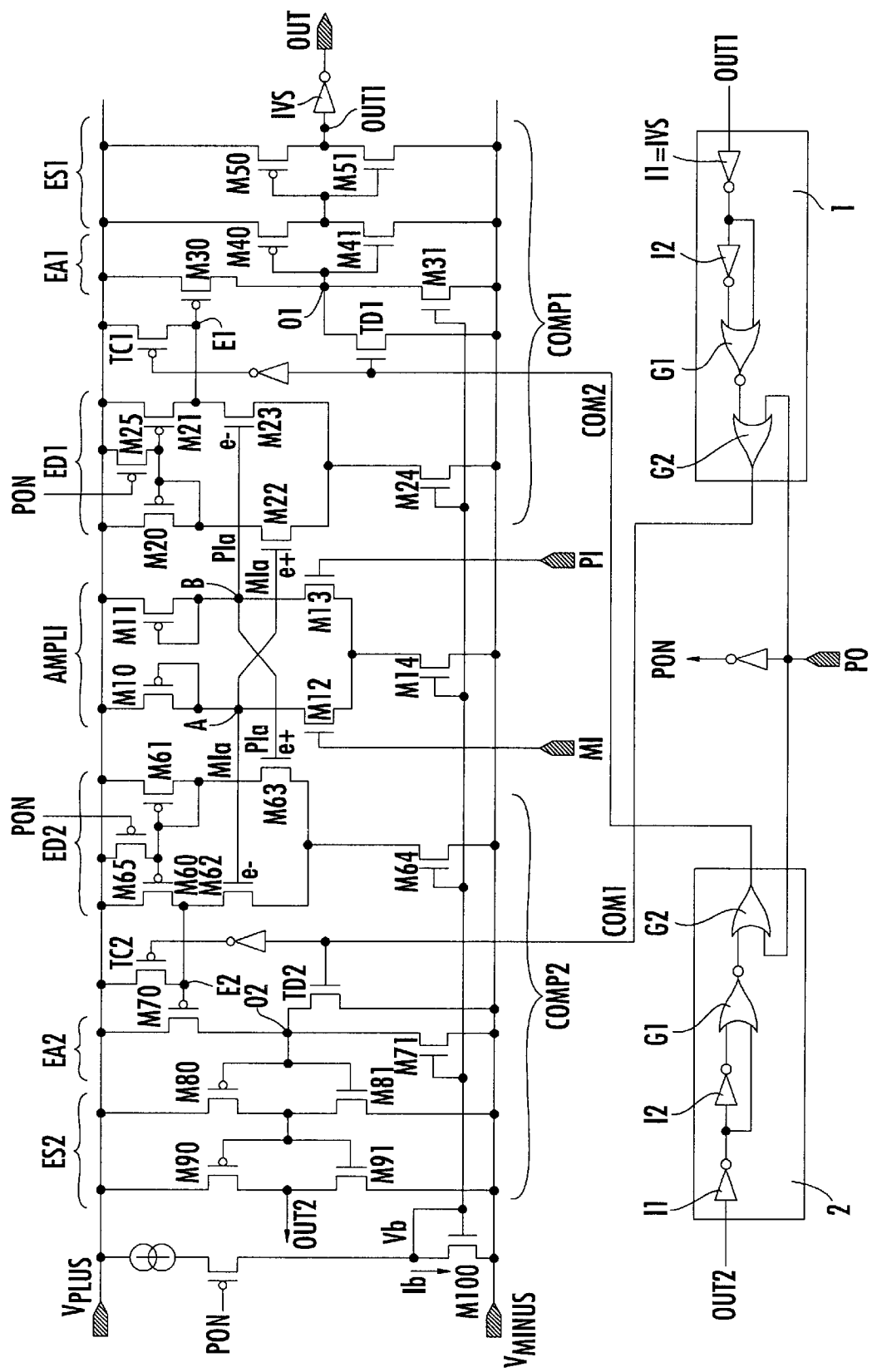
FIG. 5 is a schematic diagram of an embodiment of a comparison device according to the invention.

FIG. 5 gives an exemplary view of an embodiment of a comparison device according to the invention in a CMOS type technology. This device comprises an input amplifier stage AMPLI, two comparators COMP1 and COMP2, a current bias circuit, POL, and two logic circuits 1 and 2.

In the example, the output OUT1 of the comparator COMP1 is applied to an inverter IVS to give the output OUT of the device. The output OUT2 of the comparator COMP2 has a logic that is the inverse of that of the output OUT1, as explained further above with reference to FIGS. 3 and 4.

The input amplifier stage AMPLI commonly comprises two arms. The first arm comprises a P type MOS transistor M10 and an N type MOS transistor M12 series-connected between the supply voltage V$_{PLUS}$ and a node N1. The transistor M10 is mounted as a diode with its gate connected to its drain. The second arm similarly comprises a P type MOS transistor, M11, and an N type MOS transistor, M13, series-connected between the supply voltage V$_{PLUS}$ and a node N1. The transistor M11 is mounted as a diode with its gate connected to its drain.

The input signal MI is applied to the gate of the transistor M12 while the input signal PI is applied to the gate of the transistor M13. The connection point A between the MOS transistors M10 and M12 gives an amplified inverter signal MIa corresponding to the input signal MI. The connection point B between the MOS transistors M11 and M13 gives an amplified inverted signal PIa corresponding to the input signal PI. A current bias transistor M14 is connected between the node N1 and the supply voltage VMINUS and is controlled at its gate by a reference voltage Vb.

The amplified inverter signals MIa and PIa are applied as inputs of each of the comparators COMP1 and COMP2 of the device: the signal MIa to the non-inverting input e+ of the comparator COMP1 and to the inverting input e− of the comparator COMP2; the signal PIa to the inverting input e− of the comparator COMP1 and to the non-inverting input e+ of the comparator COMP2. These comparators have an identical, standard structure that corresponds to the one already described with reference to FIG. 1, for example.

For each comparator, COMP1 and COMP2 respectively, this structure comprises a first differential amplifier stage ED1 and ED2 respectively followed by a second amplifier stage EA1 and EA2 respectively and an output stage ES1 and ES2 respectively, comprising two inverter stages in the example.

The output signal of each comparator COMP1, COMP2 is obtained at output of the reshaping output stage.

The differential amplifier stage ED1 of the comparator COMP1 comprises two differential arms. The first arm comprises a P MOS transistor M20 mounted as a diode (with the gate and drain short-circuited) and an N MOS transistor M22. These two transistors are series-connected between the supply voltage VPLUS and a node N2. The second arm comprises a P MOS transistor M21, the gate of which is connected to the gate of the transistor M20 (current mirror) and an N MOS transistor M23. These two transistors M21 and M23 are series-connected between the supply voltage VPLUS and the node N2. The connection point between these two transistors M21 and M23 gives the output of this stage, applied to the input E1 of the second amplifier stage EA1. A current bias transistor M24 is connected between the node N21 and the supply voltage VMINUS and controlled at its gate by a reference voltage Vb.

The gate of the transistor M22 forms the non-inverting differential input e+ of the comparator COMP1. It is connected to the connection point A of the input stage AMPLI. The gate of the transistor M23 forms the inverting differential input e− of the comparator COMP1. It is connected to the connection point B of the input stage AMPLI. The second amplifier stage EA1 of the comparator COMP1 comprises a P MOS transistor M30 connected between the power supply voltage VPLUS and the node O1. A current bias transistor M31 is connected between this node O1 and the supply voltage VMINUS and is controlled at its gate by a reference voltage Vb. The node O1 is applied to the input of the output stage ES1 which, in the example, has two series-connected CMOS type inverters to give a reshaped signal OUT1 at output, this reshaped signal forming the output signal of the comparator COMP1. This signal OUT1 follows the same switching logic as the node O1.

The comparator COMP2 has an identical structure. It will therefore not be given a precise description. The non-inverting input e+ and inverting input e− of its differential amplifier stage ED2 are connected to the connection points A and B inverted with respect to those of the stage ED1. Thus, in FIG. 5, the gate of the transistor M62 which forms the non-inverting differential input e+ of the comparator COMP2 is connected to the connection point B of the input stage AMPLI and the gate of the transistor M63 which forms the inverting differential input e− of the comparator COMP2 is connected to the connection point A of the input stage AMPLI. The input and the output of the second amplifier stage EA2 are respectively referenced E2 and O2. The node O2 is applied to the input of the output stage ES2, which is identical to the stage ES1, to give a reshaped signal OUT2 at output. This signal OUT2 follows the same switching logic as the node O2.

The current biasing transistors, which are MOS transistors of a same type, N type transistors in the example, are controlled by the same reference voltage Vb. This reference voltage is usually given by a current mirror assembly comprising a transistor M100 connected as a diode (with the gate and drain connected). In an exemplary application using very low voltage, the bias current Ib will be in the range of about one hundred nanoamperes.

According to the invention, the comparison device furthermore comprises two logic circuits 1 and 2 which give a control pulse signal at output towards the circuits for charging and discharging internal nodes of the comparators COMP1 and COMP2. These logic circuits 1 and 2 are identical. If we take the logic circuit 1 associated with the output OUT1 of the comparator COMP1, it comprises, firstly, two inverting outputs I1 and I2, secondly a NOR type logic gate G1 receiving, as inputs, the output of the first inverting gate I1 and the output of the second inverting gate I2 and, thirdly, an OR type logic gate G2. Thus, when the output OUT1 goes from "0" to "1", a positive pulse Com1 is generated at output of the gate G2. The width of this pulse corresponds to the delay in transmission of the zero in the second inverting gate I2. This pulse is used to activate the charging and discharging of internal nodes of the comparator COMP2. These internal nodes are the input node E2 and output node O2 of the second gain stage EA2 of the comparator COMP2. In practice, the first inverting gate I1 corresponds in this embodiment to the output inverter IVS, and provides for a saving of one logic gate.

The logic circuit 2 associated with the output OUT2 is identical to the logic circuit 1. At output, it gives a positive pulse Com2 which activates the charging and discharging of internal nodes of the comparator COMP1. These internal nodes are the inputs node E1 and output node O1 of the second gain stage EA1 of the comparator COMP1.

The charging and discharging circuits controlled by the control pulse signals Com1 and Com2 are typically MOS transistors, controlled appropriately. For example, in the comparator COMP1, there is provided, firstly, a charging transistor TC1, which herein is a P type MOS transistor connected between the supply voltage VPLUS and the node E1 and controlled at its gate by the inverse of the control pulse signal Com1 to charge the node E1 at the voltage VPLUS and, secondly, a discharging transistor TD1 which herein is an N type MOS transistor connected between the node O1 and the supply voltage VMINUS and controlled at its gate by the control pulse signal Com1 to discharge the node E1 at the voltage VMINUS. The comparator comprises corresponding charging and discharging transistors, TC2 and TD2 respectively.

With these logic circuits, it will be understood that it is the fastest switching that is used in each comparator to force the inverse switching in the other comparator. This is the mechanism shown in FIG. 4.

FIG. 5 furthermore shows circuits for initializing the comparison device, activated when the circuit into which it is integrated is powered on. These are usual initialization circuits that will not be described in detail. They are controlled by an initialization signal Po and its inverse PON. This signal is used in the logic circuits 1 and 2, in the OR type additional gate G2, to initialize the nodes E1, E2, O1 and O2 when the device is powered on.

It will be noted that the comparators COMP1 and COMP2 may comprise, after the second gain stage, other additional gain stages. Provision is then made for corresponding charging and discharging circuits to control the charging and discharging of their input and output nodes in accordance with the principle of the invention.

That which is claimed is:

1. A device for comparing two input signals comprising:
    a first comparator for receiving the input signals and having a switching being expressed by a change-over of an output from a first logic state to a second logic state, the change-over of the output from the first logic state to the second logic state being faster than the change-over in an opposite direction;
    a second comparator for receiving inverted input signals so that the switching operations in the first and second comparators are inverted;
    a first logic circuit for receiving an output of the first comparator and for accelerating an inverse switching in the second comparator for a change in the output corresponding to a fastest change-over; and
    a second logic circuit for receiving an output of the second comparator and for accelerating an inverse switching in the first comparator for a change in the output corresponding to the fastest change-over.

2. A comparison device according to claim 1, wherein each of the comparators comprises:
    internal nodes; and
    a charging and discharging circuit for charging and discharging the internal nodes;
    wherein each logic circuit is controlled by the output of the respective comparator and outputs a pulse signal applied to the charging and discharging circuit of the other comparator.

3. A comparison device according to claim 2, wherein each comparator comprises a first amplifier stage followed by at least one second amplifier stage, and wherein the internal nodes define input and output nodes of the amplifier stages.

4. A comparison device according to claim 1, further comprising a differential amplifier stage upstream from the first and second comparators for receiving the input signals and generating amplified input signals to the comparators.

5. A comparison device according to claim 2, wherein each logic circuit comprises at least one inverter and one NOR type logic gate, a logic signal being applied directly to an input of the logic gate, and an output of the inverter being applied to the another input of the logic gate, the logic gate outputting the control pulse signal for the charging and discharging circuit.

6. A comparison device according to claim 5, wherein each logic circuit comprises an additional logic gate for activating the charging and discharging circuit during an initialization of the device.

7. An integrated circuit device for comparing two input signals comprising:
    a first comparator for receiving the input signals and having a switching being expressed by a change-over of an output of the first comparator from a first logic state to a second logic state, the change-over of the output from the first logic state to the second logic state being faster than the change-over in the opposite direction,
    a second comparator for receiving inverted input signals so that switching operations in the first and second comparators are inverted,
    a first logic circuit for receiving an output of the first comparator and for accelerating an inverse switching in the second comparator for a change in the output corresponding to a fastest change-over, and
    a second logic circuit for receiving an output of the second comparator and for accelerating an inverse switching in the first comparator for a change in the output corresponding to the fastest change-over.

8. An integrated circuit device according to claim 7, wherein each of the comparators comprises:
    internal nodes; and
    a charging and discharging circuit for charging and discharging the internal nodes;
    wherein each logic circuit is controlled by the output of the respective comparator and outputs a pulse signal applied to the charging and discharging circuit of the other comparator.

9. An integrated circuit device according to claim 8, wherein each comparator comprises a first amplifier stage followed by at least one second amplifier stage, and wherein the internal nodes define input and output nodes of the amplifier stages.

10. An integrated circuit device according to claim 7, further comprising a differential amplifier stage upstream from the first and second comparators for receiving the input signals and generating amplified input signals to the comparators.

11. An integrated circuit device according to claim 8, wherein each logic circuit comprises at least one inverter and one NOR type logic gate, a logic signal being applied directly to an input of the logic gate, and an output of the inverter being applied to the another input of the logic gate, the logic gate outputting the control pulse signal for the charging and discharging circuit.

12. An integrated circuit device according to claim 11, wherein each logic circuit comprises an additional logic gate for activating the charging and discharging circuit during an initialization of the device.

13. A method of comparing levels of two input signals comprising:
    providing a first comparator for receiving the input signals and having a switching being expressed by a change-over of an output from a first logic state to a second logic state, the change-over of the output from the first logic state to the second logic state being faster than the change-over in the opposite direction;
    providing a second comparator for receiving inverted input signals so that the switching operations in the first and second comparators are inverted;
    accelerating an inverse switching in the second comparator based upon an output of the first comparator for a change in the output corresponding to a fastest change-over; and
    accelerating an inverse switching in the first comparator based upon an output of the second comparator for a change in the output corresponding to the fastest change-over.

14. A method according to claim 13, wherein each of the comparators comprises:
    internal nodes; and
    a charging and discharging circuit for charging and discharging the internal nodes;
    wherein the inverse switching is accelerated by respective logic circuits controlled by the output of the respective comparator and which output a pulse signal applied to the charging and discharging circuit of the other comparator.

15. A method according to claim 14, wherein each comparator comprises a first amplifier stage followed by at least one second amplifier stage, and wherein the internal nodes define input and output nodes of the amplifier stages.

16. A method according to claim 13, further comprising amplifying the input signals to provide amplified input signals to the comparators.

17. A method according to claim 14, wherein each logic circuit comprises at least one inverter and one NOR type logic gate, a logic signal being applied directly to an input of the logic gate, and an output of the inverter being applied to the another input of the logic gate, the logic gate outputting the control pulse signal for the charging and discharging circuit.

18. A method according to claim 17, wherein each logic circuit comprises an additional logic gate for activating the charging and discharging circuit during an initialization of the device.

* * * * *